(12) United States Patent
Tan et al.

(10) Patent No.: US 12,413,091 B1
(45) Date of Patent: Sep. 9, 2025

(54) DETECTING AIRCRAFT IN-SEAT POWER

(71) Applicant: DELL PRODUCTS L.P., Round Rock, TX (US)

(72) Inventors: Geroncio O. Tan, Austin, TX (US); Wei-Cheng Yu, New Taipei (TW); Chi-Che Wu, Taipei (TW)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 18/644,850

(22) Filed: Apr. 24, 2024

(51) Int. Cl.
*H02J 7/00* (2006.01)
*G01R 19/165* (2006.01)
*H02J 7/34* (2006.01)
*B64D 11/06* (2006.01)

(52) U.S. Cl.
CPC ........ *H02J 7/345* (2013.01); *G01R 19/16576* (2013.01); *B64D 11/0624* (2014.12); *H02J 2207/20* (2020.01); *H02J 2207/50* (2020.01)

(58) Field of Classification Search
CPC ...... H02J 7/00; H02J 7/007; H02J 7/02; H02J 7/04; H02J 7/345; H02M 1/42; H02M 1/4208; G01R 19/165; G01R 19/16566; G01R 19/16576
USPC .......... 307/2, 9.1, 24, 31, 35, 126, 128, 130, 307/131; 323/207; 363/74, 78, 79, 81
See application file for complete search history.

(56) References Cited

U.S. PATENT DOCUMENTS 9,466,974 B2 * 10/2016 Hsieh ................. H02H 7/16
11,437,914 B2 * 9/2022 Yu .................... G06F 1/266
2021/0323677 A1 10/2021 D'Alessio et al.

* cited by examiner

*Primary Examiner* — Hai L Nguyen
(74) *Attorney, Agent, or Firm* — Larson Newman, LLP

(57) ABSTRACT

A power adaptor provides power from a power source to a load device. The power adaptor includes a bulk capacitor and a controller. The controller detects a voltage level of input power from the power source, charges the bulk capacitor, detects a distortion of the voltage level in response to charging the bulk capacitor, and sets an output power limit for the power adaptor from a maximum output power limit for the power adaptor to a reduced output power limit in response to detecting the distortion.

20 Claims, 4 Drawing Sheets

DETECTING AIRCRAFT IN-SEAT POWER

FIELD OF THE DISCLOSURE

This disclosure generally relates to information handling systems, and more particularly relates to detecting aircraft in-seat power in an information handling system.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, reservations, enterprise data storage, or global communications. In addition, information handling systems may include a variety of hardware and software resources that may be configured to process, store, and communicate information and may include one or more computer systems, data storage systems, and networking systems.

SUMMARY

A power adaptor may provide power from a power source to a load device. The power adaptor may include a bulk capacitor and a controller. The controller may detect a voltage level of input power from the power source, charge the bulk capacitor, detect a distortion of the voltage level in response to charging the bulk capacitor, and set an output power limit for the power adaptor from a maximum output power limit for the power adaptor to a reduced output power limit in response to detecting the distortion.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

The following description in combination with the Figures is provided to assist in understanding the teachings disclosed herein. The following discussion will focus on specific implementations and embodiments of the teachings. This focus is provided to assist in describing the teachings, and should not be interpreted as a limitation on the scope or applicability of the teachings. However, other teachings can certainly be used in this application.

The teachings can also be used in other applications, and with several different types of architectures, such as distributed computing architectures, client/server architectures, or middleware server architectures and associated resources.

Figure 1A:
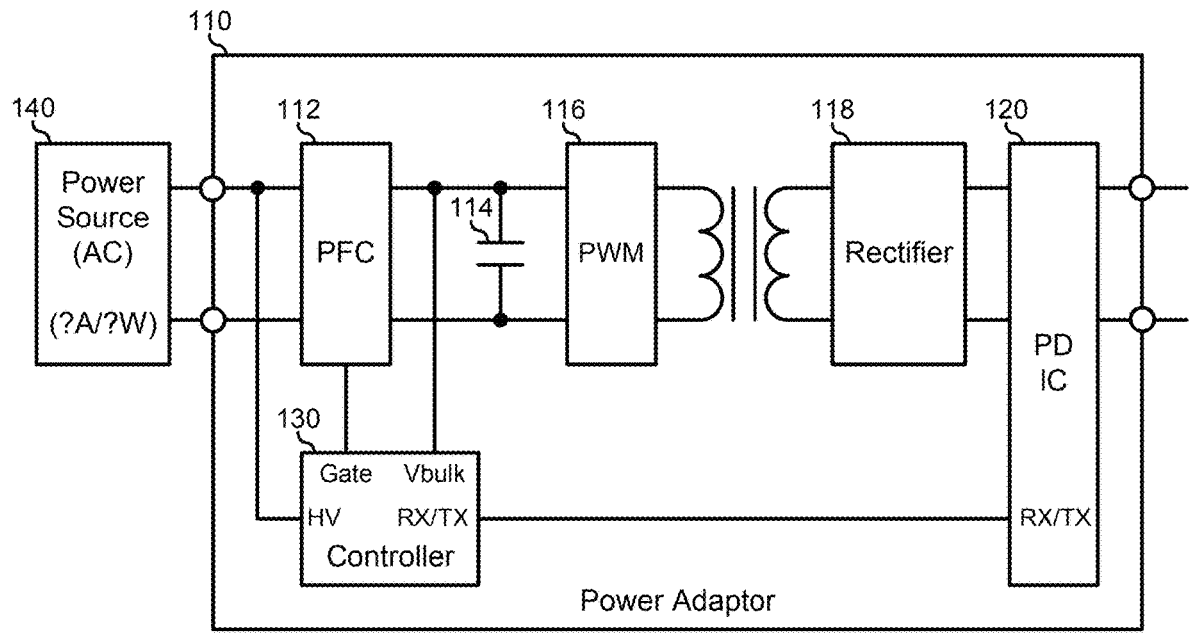
FIG. 1A is a block diagram illustrating a power adaptor for an information handling system according to an embodiment of the present disclosure.

FIG. 1A illustrates a power adaptor 110 that is plugged into an alternating current (AC) power source 140. Power adaptor 110 includes a power factor correction boost regulator stage 112 (hereinafter "PFC 112"), a bulk capacitor 114, a pulse-width modulation stage 116 (hereinafter "PWM 116"), a rectifier stage 118, a power delivery integrated circuit 120 (hereinafter "PD IC 120"), and a power adaptor controller 130 (hereinafter "controller 140"). PFC 112 receives AC power from power source 140, and provides a power-factor corrected output of the received AC power to PWM 116. Bulk capacitor 114 is connected between the output of PFC 112. PWM 116 is electrically coupled to rectifier 118 via a transformer. The transformer may be an isolation transformer, a step-up transformer, or a step-down transformer, as needed or desired. Rectifier 118 converts the AC power to DC power at a predetermined voltage level. PD IC 120 provides the DC power to a load device. Controller 130 controls the operations of power adaptor 110. In particular, controller 130 is connected to detect the input voltage (HV) from power source 140, to detect the voltage (Vbulk) on bulk capacitor 114, and to provide an output (Gate) to control PFC 112.

PD IC 120 also provides a communication channel with the load device to negotiate the configuration of the power delivered to the load device. For example, the load device may be limited as to the current or power level that the load device can handle, but power adaptor 110 may be configurable to provide a greater current or power level than the load device can handle. The load device can communicate the power limits to PD IC 120 and power adaptor 110 can configure itself to not exceed the received power limits. Similarly, power adaptor 110 may be configured to provide a lower current or power level than the load device can handle. In either case, PD IC 120 and the load device. PD IC 120 can communicate the power limits to the load device, and the load device can configure itself to consume no more power than power adaptor 110 can deliver. As such, PD IC 120 is connected via a communication interface to controller 130 (TX/RX signals). The details of power conversion in a power adaptor like power adaptor 110, and particularly of providing power factor correction to an input power source, are known in the art and will not be further described herein, except as may be needed to illustrate the current embodiments. The details of communicating between a power adaptor and a load device are likewise known in the art and will not be further described herein, except as may be needed to illustrate the current embodiments.

Power adaptor 110 represents a power device configured to receive the AC power from power source 140, and to convert the AC power to a power configuration (typically direct current (DC) power) that is usable by an information handling system such as a laptop computer, a desktop computer, a mobile device like a cell phone or tablet device, or other electronic equipment. Power source 140 is characterized by the fact that the power source may be limited as to the output current or output power. For example, while AC power receptacles are becoming commonplace on aircraft, nevertheless, such power adaptors may not have the power delivery capacity that is normally associated with standard AC power receptacles. In particular, a standard AC power receptacle may typically power appliances of up to 1350 Watts, while an AC power receptacle provided in an airplane may be limited to 60-100 Watts. At the same time, the maximum power consumption of a high-end performance laptop may exceed 200 Watts. If a power adaptor designed to power a high-end performance laptop is plugged into an aircraft AC power receptacle, then the resulting current draw will trip the circuit breaker for the receptacle, possibly resulting in power disruptions for multiple seats in the aircraft.

Power adaptor 110 operates to determine whether or not power source 140 is underpowered for the power adaptor. As illustrated, power source 140 is shown as being of unknown current capacity and unknown power capacity (?A/?W). In determining whether or not power source 140 is underpowered, power adaptor 110 operates to detect distortions in PFC 112. In particular, by detecting the behavior of the AC input voltage during a boost phase of the PFC 112, it is possible to identify and distinguish underpowered sources, such as aircraft in-seat power supplies, from regular utility power sources. More specifically, in an initial boost phase of PFC 112, the power drawn from the AC power source 140 is increased, and, if the power source is limited, it's sinusoidal voltage waveform will collapse or distort. By monitoring this distortion, a conclusion can be made that power source 140 is not capable of providing sufficient power (that is, that the power source is an aircraft in-seat power source). If power source 140 is an underpowered power source, then power adaptor 110 operates to renegotiate a new, lower, power limits with the connected load device. In a particular embodiment, controller 130 operates to determine that power source 140 is an aircraft power source, and to direct PD IC 120 to communicate that the power source is an aircraft power source to the load device.

Figure 2:
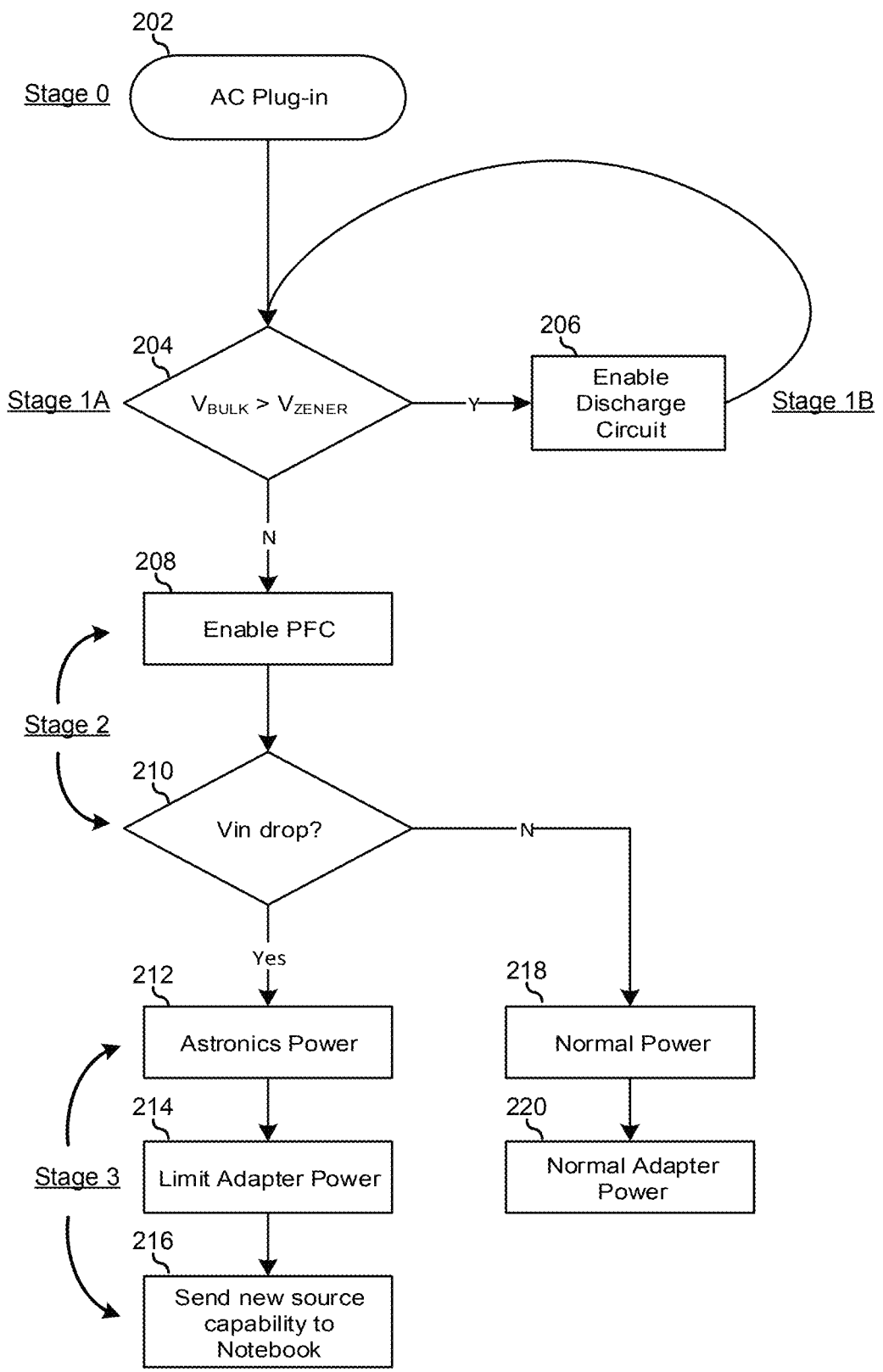
FIG. 2 is a flowchart illustrating a method for detecting aircraft in-seat power according to an embodiment of the current disclosure.
Figure 3:
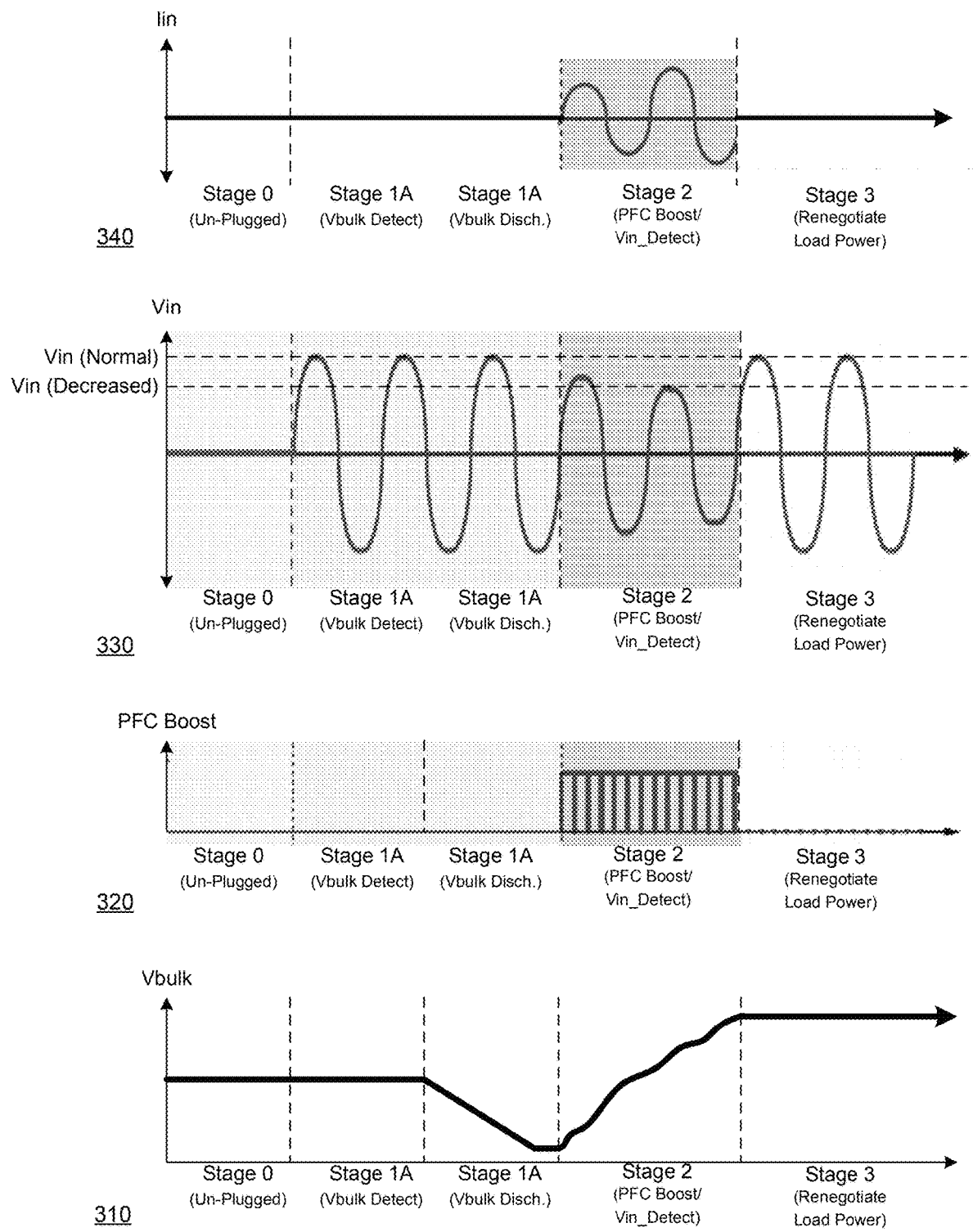
FIG. 3 shows graphs illustrating the method of FIG. 2.

FIG. 2 illustrates a method 200 for detecting aircraft in-seat power starting at step 202 where a power adaptor is plugged into an AC power source. The stages of method 200 are illustrated in the graphs of FIG. 3. In particular, a graph 310 illustrates a voltage as detected on a bulk capacitor of a PFC boost converter power adaptor such as power adaptor 110, a graph 320 illustrates PFC boost operations of the PFC boost converter, a graph 330 illustrates the detected AC input voltage from the power source, and a graph 340 illustrates a detected input current from the power source. Graphs 310, 320, 330, and 340 are shown as demarked by a Stage 0 when the power adaptor is unplugged from the power source, a Stage 1 when the poser adaptor is plugged into the power source, but when PFC boost operations are not initiated, a Stage 3 when the PFC boost operations are initiated and the input voltage is monitored to detect whether or not the input voltage drops, and a Stage 4 when, after detecting an input voltage drop, the PFC boost operations are halted and a new power limit is negotiated with the load device. Stage 1 is further divided into a Stage 1A when a residual voltage is detected on the bulk capacitor, and a Stage 1B when any residual voltage on the bulk capacitor is discharged.

Figure 1B:
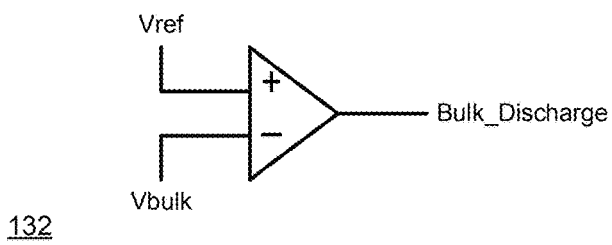
FIG. 1B is a circuit diagram of a bulk capacitor discharge circuit of the power adaptor of FIG. 1A.

In a step 204 corresponding with Stage 1A, the voltage on the bulk capacitor is compared to a reference voltage. For example, a voltage across a Zener diode may be utilized as a reference voltage. FIG. 1B illustrates a circuit 132 for detecting whether or not a residual voltage on the bulk capacitor is greater than the reference voltage. Here, the bulk capacitor voltage is provided to a positive input of a comparator, and the reference voltage is provided to a negative input. Then, when the bulk capacitor voltage is greater than the reference voltage, an output of the comparator (Bulk_Discharge) is provided to enable a discharge circuit for the bulk capacitor. The output (Bulk_Discharge) will remain enabled until the bulk capacitor voltage is equal to or lower than the reference voltage. An example of a bulk capacitor discharge circuit may include a FET device connected in series with the bulk capacitor that is turned on by the assertion of the Bulk_Discharge signal. Circuit 132 may be implemented in a PFC module, in a controller, as discrete circuit elements, or as another implementation, as needed or desired. Graph 310 illustrates a case in Stage 1A where a residual voltage is detected on the bulk capacitor. When the bulk capacitor voltage is greater than the reference voltage, the "Y" branch of step 204 is taken and a step 206 corresponding with Stage 1B is performed. In step 206, the discharge circuit is performed until the bulk capacitor voltage is not greater than the reference voltage. Graph 310 illustrates a case in Stage 1B where the residual voltage on the bulk capacitor is discharged.

The discharging of residual voltage on the bulk capacitor is performed so that, in the subsequent steps, corresponding with Stage 2, when the PFC boost operations are initiated, the inrush current to charge the bulk capacitor is high enough to drop the input voltage from the power source. In other words, if the bulk capacitor retains a residual voltage, then the initiation of the PFC boost operations will not result in a substantial current draw from the power source, and the limits of the power source may not be exceeded, in order to cause a discernable voltage drop on the input voltage. When the bulk capacitor voltage is less than the reference voltage, the "N" branch of step 204 is taken and the PFC boost operations are initiated in step 208, corresponding with start of Stage 2. In step 210, the input voltage from the power source is detected.

Figure 1C:
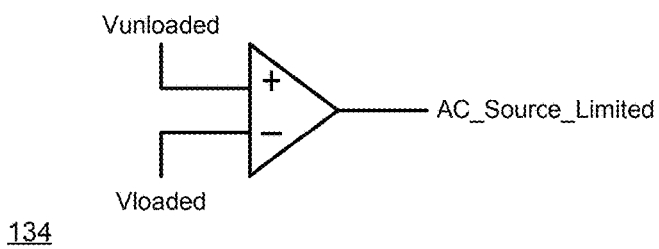
FIG. 1C is a circuit diagram of an input voltage detection circuit of the power adaptor of FIG. 1A.

For example, the voltage at the input at the time before the PFC boost operations (Vunloaded) can be compared with the voltage after the PFC boost operations have been initiated (Vloaded). FIG. 1C illustrates a circuit 134 for detecting whether or not the input voltage drops in response to the initiation of the PFC boost operations. The unloaded voltage (Vunloaded) is provided to a positive input of a comparator, and the loaded voltage (Vloaded) is provided to a negative input. Then when the loaded voltage (Vloaded) is greater than or equal to the unloaded voltage (Vunloaded), indicating that the power source has sufficient output capacity, the output (AC_Source_Limited) remains in the low logic state. When the loaded voltage (Vloaded) is less than the unloaded voltage (Vunloaded), the power source has insufficient output capacity, and the output (AC_Source_Limited) is asserted. The unloaded voltage (Vunloaded) and the loaded voltage (Vloaded) may be both be obtained by sampling the input voltage to a PFC like PFC 112. The unloaded voltage (Vunloaded) can be obtained prior to the initiation of the PFC boost operations by a sample-and-hold circuit, a delay circuit, or the like, while the loaded voltage (Vloaded) can be obtained by real-time voltage measurements, as needed or desired. Circuit 134 may be implemented in a PFC module, in a controller, as discrete circuit elements, or as another implementation, as needed or desired. Graphs 320 and 330 illustrate the case in Stage 2 when the input voltage drops as compared with the unloaded input voltage.

When the loaded voltage drops below the unloaded voltage, the "Y" branch of step 210 is taken, corresponding with Stage 3. The power source is determined to be an aircraft power source in step 212, the power adaptor input power draw is limited in step 214, and the power adaptor negotiates a new, lower, power limit with the load device. When the loaded voltage does not drop, the "N" branch of step 210 is taken. The power source is determined to not be limited as to its output power, i.e., the power source is a normal power source, in step 218, and the power adaptor is configured in accordance with the negotiated limits with the load device.

The embodiments as described herein may be utilized to adapt a high-capacity power adaptor to operate compatibly with low-capacity power sources, as needed or desired. For example, a power adaptor as may be provided with a high-end performance laptop, or the like, may be utilized with low-capacity power sources such as aircraft power sources. Such a high-end performance laptop may need to operate in a lower performance mode or otherwise operate to reduce power consumption in order to retain an adequate battery life. The details of device power states, battery life optimization, and other steps to adapt to a lower power limit for a power adaptor are known in the art and will not be further described herein, except as may be needed to illustrate the current embodiments.

Figure 4:
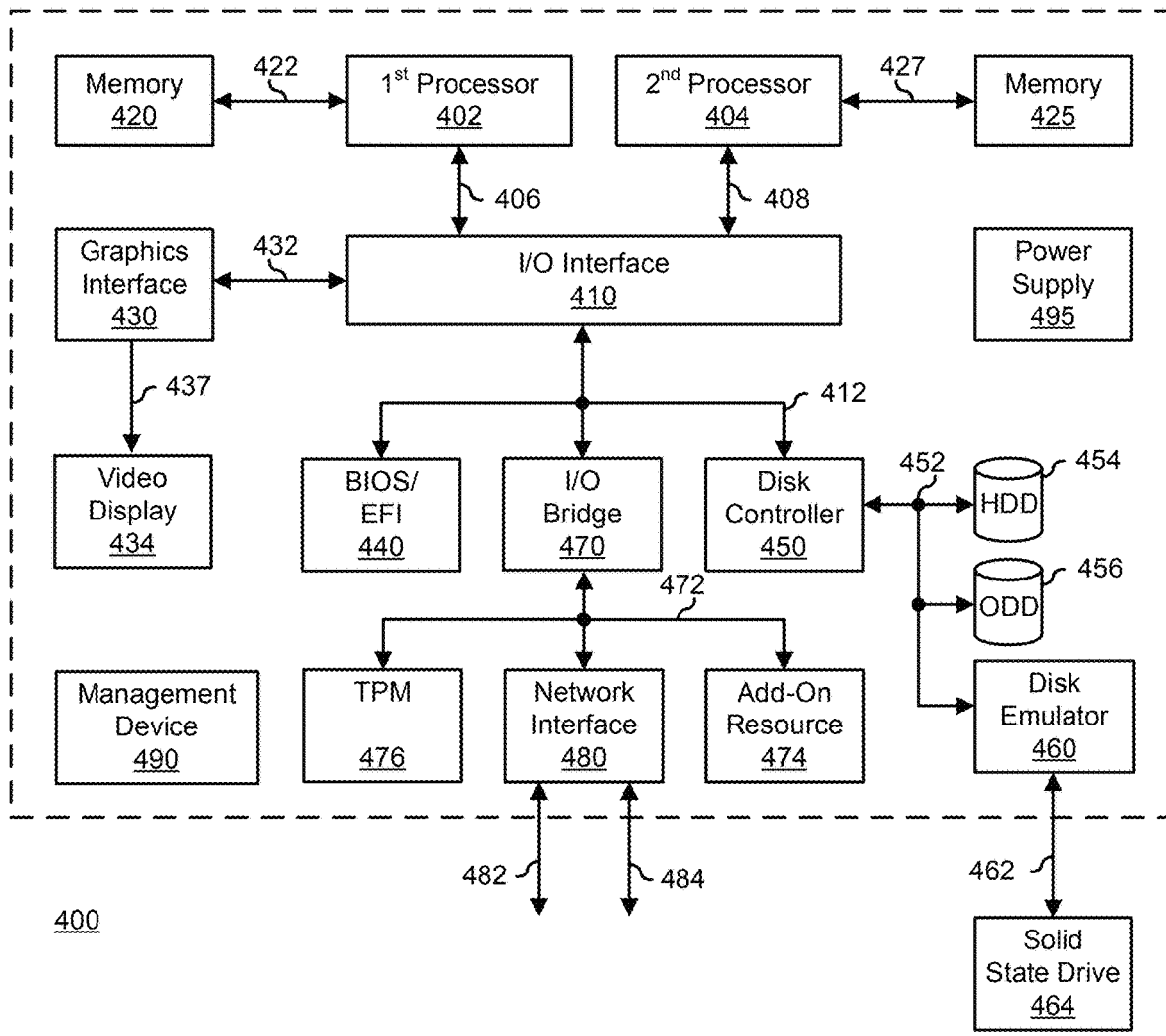
FIG. 4 is a block diagram illustrating a generalized information handling system according to another embodiment of the present disclosure.

FIG. 4 illustrates a generalized embodiment of an information handling system 400 similar to information handling system 400. For purpose of this disclosure an information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 400 can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 400 can include processing resources for executing machine-executable code, such as a central processing unit (CPU), a programmable logic array (PLA), an embedded device such as a System-on-a-Chip (SoC), or other control logic hardware. Information handling system 400 can also include one or more computer-readable medium for storing machine-executable code, such as software or data. Additional components of information handling system 400 can include one or more storage devices that can store machine-executable code, one or more communications ports for communicating with external devices, and various input and output (I/O) devices, such as a keyboard, a mouse, and a video display. Information handling system 400 can also include one or more buses operable to transmit information between the various hardware components.

Information handling system 400 can include devices or modules that embody one or more of the devices or modules described below, and operates to perform one or more of the methods described below. Information handling system 400 includes a processors 402 and 404, an input/output (I/O) interface 410, memories 420 and 425, a graphics interface 430, a basic input and output system/universal extensible firmware interface (BIOS/UEFI) module 440, a disk controller 450, a hard disk drive (HDD) 454, an optical disk drive (ODD) 456, a disk emulator 460 connected to an external solid state drive (SSD) 462, an I/O bridge 470, one or more add-on resources 474, a trusted platform module (TPM) 476, a network interface 480, a management device 490, and a power supply 495. Processors 402 and 404, I/O interface 410, memory 420, graphics interface 430, BIOS/UEFI module 440, disk controller 450, HDD 454, ODD 456, disk emulator 460, SSD 462, I/O bridge 470, add-on resources 474, TPM 476, and network interface 480 operate together to provide a host environment of information handling system 400 that operates to provide the data processing functionality of the information handling system. The host environment operates to execute machine-executable code, including platform BIOS/UEFI code, device firmware, operating system code, applications, programs, and the like, to perform the data processing tasks associated with information handling system 400.

In the host environment, processor 402 is connected to I/O interface 410 via processor interface 406, and processor 404 is connected to the I/O interface via processor interface 408. Memory 420 is connected to processor 402 via a memory interface 422. Memory 425 is connected to processor 404 via a memory interface 427. Graphics interface 430 is connected to I/O interface 410 via a graphics interface 432, and provides a video display output 436 to a video display 434. In a particular embodiment, information handling system 400 includes separate memories that are dedicated to each of processors 402 and 404 via separate memory interfaces. An example of memories 420 and 430 include random access memory (RAM) such as static RAM (SRAM), dynamic RAM (DRAM), non-volatile RAM (NV-RAM), or the like, read only memory (ROM), another type of memory, or a combination thereof.

BIOS/UEFI module 440, disk controller 450, and I/O bridge 470 are connected to I/O interface 410 via an I/O channel 412. An example of I/O channel 412 includes a Peripheral Component Interconnect (PCI) interface, a PCI-Extended (PCI-X) interface, a high-speed PCI-Express (PCIe) interface, another industry standard or proprietary communication interface, or a combination thereof. I/O interface 410 can also include one or more other I/O interfaces, including an Industry Standard Architecture (ISA) interface, a Small Computer Serial Interface (SCSI) interface, an Inter-Integrated Circuit (I2C) interface, a System Packet Interface (SPI), a Universal Serial Bus (USB), another interface, or a combination thereof. BIOS/UEFI module 440 includes BIOS/UEFI code operable to detect resources within information handling system 400, to provide drivers for the resources, initialize the resources, and access the resources. BIOS/UEFI module 440 includes code that operates to detect resources within information handling system 400, to provide drivers for the resources, to initialize the resources, and to access the resources.

Disk controller 450 includes a disk interface 452 that connects the disk controller to HDD 454, to ODD 456, and to disk emulator 460. An example of disk interface 452 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 460 permits SSD 464 to be connected to information handling system 400 via an external interface 462. An example of external interface 462 includes a USB interface, an IEEE 1394 (Firewire) interface, a proprietary interface, or a combination thereof. Alternatively, solid-state drive 464 can be disposed within information handling system 400.

I/O bridge 470 includes a peripheral interface 472 that connects the I/O bridge to add-on resource 474, to TPM 476, and to network interface 480. Peripheral interface 472 can be the same type of interface as I/O channel 412, or can be a different type of interface. As such, I/O bridge 470 extends the capacity of I/O channel 412 where peripheral interface 472 and the I/O channel are of the same type, and the I/O bridge translates information from a format suitable to the I/O channel to a format suitable to the peripheral channel 472 where they are of a different type. Add-on resource 474 can include a data storage system, an additional graphics interface, a network interface card (NIC), a sound/video processing card, another add-on resource, or a combination thereof. Add-on resource 474 can be on a main circuit board, on separate circuit board or add-in card disposed within information handling system 400, a device that is external to the information handling system, or a combination thereof.

Network interface 480 represents a NIC disposed within information handling system 400, on a main circuit board of the information handling system, integrated onto another component such as I/O interface 410, in another suitable location, or a combination thereof. Network interface device 480 includes network channels 482 and 484 that provide interfaces to devices that are external to information handling system 400. In a particular embodiment, network channels 482 and 484 are of a different type than peripheral channel 472 and network interface 480 translates information from a format suitable to the peripheral channel to a format suitable to external devices. An example of network channels 482 and 484 includes InfiniBand channels, Fibre Channel channels, Gigabit Ethernet channels, proprietary channel architectures, or a combination thereof. Network channels 482 and 484 can be connected to external network resources (not illustrated). The network resource can include another information handling system, a data storage system, another network, a grid management system, another suitable resource, or a combination thereof.

Management device 490 represents one or more processing devices, such as a dedicated baseboard management controller (BMC) System-on-a-Chip (SoC) device, one or more associated memory devices, one or more network interface devices, a complex programmable logic device (CPLD), and the like, that operate together to provide the management environment for information handling system 400. In particular, management device 490 is connected to various components of the host environment via various internal communication interfaces, such as a Low Pin Count (LPC) interface, an Inter-Integrated-Circuit (I2C) interface, a PCIe interface, or the like, to provide an out-of-band (OOB) mechanism to retrieve information related to the operation of the host environment, to provide BIOS/UEFI or system firmware updates, to manage non-processing components of information handling system 400, such as system cooling fans and power supplies. Management device 490 can include a network connection to an external management system, and the management device can communicate with the management system to report status information for information handling system 400, to receive BIOS/UEFI or system firmware updates, or to perform other task for managing and controlling the operation of information handling system 400. Management device 490 can operate off of a separate power plane from the components of the host environment so that the management device receives power to manage information handling system 400 where the information handling system is otherwise shut down. An example of management device 490 include a commercially available BMC product or other device that operates in accordance with an Intelligent Platform Management Initiative (IPMI) specification, a Web Services Management (WSMan) interface, a Redfish Application Programming Interface (API), another Distributed Management Task Force (DMTF), or other management standard, and can include an Integrated Dell Remote Access Controller (iDRAC), an Embedded Controller (EC), or the like. Management device 490 may further include associated memory devices, logic devices, security devices, or the like, as needed or desired.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A power adaptor to provide power from a power source to a load device, the power adaptor comprising:
    a bulk capacitor; and
    a controller configured to detect a voltage level of input power from the power source, to charge the bulk capacitor, to detect a distortion of the voltage level in response to charging the bulk capacitor, and to set an output power limit for the power adaptor from a maximum output power limit for the power adaptor to a reduced output power limit in response to detecting the distortion.

2. The power adaptor of claim 1 wherein, in response to coupling the power adaptor to the power source, the controller is further configured to determine whether or not a residual voltage on the bulk capacitor is greater than a reference voltage.

3. The power adaptor of claim 2 wherein, when the residual voltage on the bulk capacitor is greater than the reference voltage, the controller is further configured to discharge the residual voltage.

4. The power adaptor of claim 3, wherein charging the bulk capacitor is in response to determining that the residual voltage on the bulk capacitor is not greater than the reference voltage.

5. The power adaptor of claim 2, wherein the reference voltage is based upon a Zener diode voltage.

6. The power adaptor of claim 1, further comprising a power factor correction module configured to charge the bulk capacitor.

7. The power adaptor of claim 1, wherein detecting the distortion of the voltage level includes detecting a drop in the voltage level.

8. The power adaptor of claim 1, further comprising a communication module coupled to the controller and configured to communicate with the load device coupled to an output of the power adaptor.

9. The power adaptor of claim 8, wherein the communication module is further configured to communicate the reduced output power limit to the load device.

10. The power adaptor of claim 1, wherein, in response to detecting the distortion of the voltage level, the controller is further configured to determine that the power source is an aircraft power source.

11. A method for providing from a power source to a load device, the method comprising:
providing, in a power adaptor, a bulk capacitor;
providing, in the power adaptor, a controller;
detecting, by the controller, a voltage level of input power from the power source;
charging the bulk capacitor;
detecting, by the controller, a distortion of the voltage level in response to charging the bulk capacitor; and
setting an output power limit for the power adaptor from a maximum output power limit for the power adaptor to a reduced output power limit in response to detecting the distortion.

12. The method of claim 11 wherein, in response to coupling the power adaptor to the power source, the method further comprises determining, by the controller, whether or not a residual voltage on the bulk capacitor is greater than a reference voltage.

13. The method of claim 12 wherein when the residual voltage on the bulk capacitor is greater than the reference voltage, the method further comprises discharging the residual voltage.

14. The method of claim 13, wherein charging the bulk capacitor is in response to determining that the residual voltage on the bulk capacitor is not greater than the reference voltage.

15. The method of claim 12, wherein the reference voltage is based upon a Zener diode voltage.

16. The method of claim 11 further comprising providing, in the power adaptor, a power factor correction module, wherein charging the bulk capacitor is by the power factor correction module.

17. The method of claim 11 wherein detecting the distortion of the voltage level includes detecting a drop in the voltage level.

18. The method of claim 11, further comprising:
providing, in the power adaptor, a communication module coupled to the controller; and
communicating, by the communication module, with the load device coupled to an output of the power adaptor.

19. The method of claim 18 wherein in communicating with the load device, the method further comprises communicating the reduced output power limit.

20. A power adaptor to provide power from a power source to a load device, the power adaptor comprising:
a bulk capacitor;
a power factor correction module configured to charge the bulk capacitor;
a controller configured to detect a voltage level of input power from the power source, to direct the power factor correction module to charge the bulk capacitor, to detect a distortion of the voltage level in response to charging the bulk capacitor, and to set an output power limit for the power adaptor from a maximum output power limit for the power adaptor to a reduced output power limit in response to detecting the distortion; and
a communication module coupled to the controller and configured to communicate the reduced output power limit to the load device coupled to an output of the power adaptor.

* * * * *